US007093176B2

(12) United States Patent
Nicolaidis et al.

(10) Patent No.: US 7,093,176 B2
(45) Date of Patent: Aug. 15, 2006

(54) PROGRAMMABLE TEST FOR MEMORIES

(75) Inventors: Michaël Nicolaidis, Saint Egreve (FR); Slimane Boutobza, Grenoble (FR)

(73) Assignee: iRoC Technologies, Grenoble (FR)

( * ) Notice: Subject to any disclaimer, the term of this patent is extended or adjusted under 35 U.S.C. 154(b) by 422 days.

(21) Appl. No.: 10/379,126

(22) Filed: Mar. 3, 2003

(65) Prior Publication Data

US 2003/0167431 A1    Sep. 4, 2003

(30) Foreign Application Priority Data

Mar. 4, 2002    (EP)    .................................... 02354040

(51) Int. Cl.
*G01R 31/28*    (2006.01)

(52) U.S. Cl. .......................... 714/733; 714/30; 714/819
(58) Field of Classification Search .................... None
See application file for complete search history.

(56) References Cited

U.S. PATENT DOCUMENTS

| 5,173,906 | A | * | 12/1992 | Dreibelbis et al. | .......... 714/733 |
| 5,633,877 | A | * | 5/1997 | Shephard et al. | ........... 714/725 |
| 5,771,242 | A | * | 6/1998 | Adams et al. | ............... 714/738 |
| 5,790,564 | A | * | 8/1998 | Adams et al. | ............... 714/738 |
| 6,567,942 | B1 | * | 5/2003 | Shepard, III | ................. 714/726 |
| 2003/0145261 | A1 | * | 7/2003 | Tanizaki | ..................... 714/718 |
| 2003/0167426 | A1 | * | 9/2003 | Slobodnik | .................. 714/718 |
| 2004/0158786 | A1 | * | 8/2004 | Caty et al. | ................... 714/733 |

OTHER PUBLICATIONS

Zarrineh et al., "On Programmable Memory Built-in Self Test Architecture", Design, Automation and Test in Europe, 1999, Mar. 9-12, 1999, pp. 708-713.*
European Search Report for application EP 02 35 4040 dated Sep. 4, 2003.
A. J. van de Goor, "Testing Semiconductor Memories", Theory and Practice, Publ. John Wiley & Sons, 1991, 8 pgs.
M Marinescu, "Simple and Efficient Algorithms for Functional RAM Testing", IEEE Test Conference, 1982, pp. 236-239.
R. Nair et al., "Efficient Algorithms for Testing Semiconductor Random-Access Memories", IEEE Transactions on Computers, vol. c-27, No. 6, Jun. 1978, pp. 572-576.
D. S. Suk et al., "A March Test for Functional Faults in Semiconductor Random Access Memories", IEEE Transactions on Computers, vol. c-30, No. 12, Dec. 1981, pp. 982-985.
S. M. Thatts et al., "Testing of Semiconductor Random Access Memories", Univ. of Illinois, Coord. Science Lab., pp. 81-87.

* cited by examiner

*Primary Examiner*—Guy Lamarre
*Assistant Examiner*—John P. Trimmings
(74) *Attorney, Agent, or Firm*—Erwin J. Basinski (57) ABSTRACT

A programmable built in self test, BIST, system for testing a memory, comprises an instruction register formed in the same chip as the memory; a circuit for loading the register by successive instructions, each instruction comprising at least one address control field, a first number (m) of operation fields, a number-of-operations field specifying a second number t+1, with t+1≦m; a circuit controlled by the address control field to determine successive addresses; and a cycle controller for executing, for each successive address, the second number (t+1) of successive operations, each of which is determined by one of the t+1 first operation fields.

14 Claims, 3 Drawing Sheets

PROGRAMMABLE TEST FOR MEMORIES

CROSS-REFERENCE TO RELATED APPLICATIONS

This application is related to the following issued patent and co-pending U.S. applications:

U.S. Pat. No. 6,946,985 B2 issued Sep. 20, 2005 titled "Device for Reconfiguring a Faulty Storage Assembly."

U.S. patent application Ser. No. 09/936,032 filed Mar. 11, 2002, titled "Logic Circuit Protected Against Transient Disturbances." (51484000100)

U.S. patent application Ser. No. 10/286,686 filed Nov. 1, 2002, titled "Reconfiguration Device for a Faulty Memory."

U.S. patent application Ser. No. 10/650,066 filed Aug. 8, 2003, titled "Evaluation of the Characteristics of Electric Pulses."

U.S. patent application Ser. No. 10/492,294 filed Apr. 9, 2004, titled "Circuit Architecture Protected Against Perturbations."

U.S. patent application Ser. No. 10/494,080 filed Jul. 6, 2004, titled "Data Storage Method with Error Correction."

This application claims priority benefit of European Patent Application No. 02354040.4, filed Mar. 4, 2002.

BACKGROUND OF THE INVENTION

1. Field of the Invention

The invention relates to the test of memories.

2. Description of the Related Art

Today Built-In Self-Test (BIST) is the mainstream test technology for embedded memories. It has replaced the external testing of embedded memories because it solves some significant limitations of the latter, such as:

- the cost of test equipment for testing complex systems on a chip (SOC) that includes both memory and logic,
- the difficulties for applying in a non-scan design the highly sequential memory test algorithms by propagating test vectors through the various blocks surrounding an embedded memory,
- the difficulties for applying one test per clock in a scan based design,
- the difficulties for applying test vectors at-speed, caused by the lower speed of the external test equipment with respect to advanced chip designs, and by the long delays introduced by the interconnections of the board.

The latter problem will be encountered even if a direct access mechanism is implemented between the inputs/outputs of the embedded memory and the inputs/outputs of the chip, which can be done for instance by using a multiplexing.

Since the BIST hardware is implemented in the same chip as the memory, all these problems are not encountered. Thus, the BIST can be used for testing embedded memories at their operation speed (at-speed). In addition, memory BIST reduces significantly the test cost of complex systems on a chip, since we can test a system on a chip including embedded memories by using an Automatic Test Equipment (ATE) designed for testing logic designs. However, BIST has a significant limitation with respect to external test equipment. In fact, once the BIST hardware has been implemented, we can test the memory only by means of the test algorithm implemented in the BIST hardware. This is not a significant drawback for situations where the memory design and the fabrication process have been stabilized, and there is enough experience for determining the basic defect types encountered for a given memory design and fabrication process and for developing a test algorithm that can guaranty the detection of these faults during manufacturing testing. Unfortunately, in many other situations conventional BIST is not a convenient approach. Such situations are for instance memory debugging for determining the principal fault types related to a new memory design and fabrication process.

Failure analysis on failed components returned from customers is another situation where the rigidity of conventional BIST is unsuitable.

Due to these problems, many companies implement a memory BIST for achieving at-speed testing of embedded memories, and use multiplexing for creating direct access on the inputs/outputs of the embedded memories, in order to maintain the flexibility in terms of test algorithms offered by external test equipment. Thus, BIST based testing can be used for fabrication testing, while external testing can be used to apply any test algorithm required for debugging and failure analysis. However, the debugging and failure analysis of faulty components returned from the field will not be performed at-speed, thus, reducing the efficiency of these tasks.

A solution for improving this situation is to implement a conventional BIST scheme that implements a large variety of test algorithms, but the cost of the BIST hardware can become prohibitive, and the test algorithms that can be executed after fabrication will be limited to those selected during the BIST implementation.

SUMMARY OF THE INVENTION

This invention presents a programmable BIST approach that combines the advantages of the Built-In Self-Test and external test approaches while eliminating their limitations.

1. Selection of Test Algorithm Families for Highly Flexible and low Cost BIST

To achieve an at-speed highly flexible testing of embedded memories, the invention combines the intelligence of the external test equipment, for determining the test algorithm at any time after circuit fabrication, with the at-speed test application offered by the BIST approach. The BIST hardware is used for applying a test algorithm that is determined by the external test equipment. This is a difficult task. In fact, since we are targeting a very high (if possible unlimited) flexibility, in terms of memory fault models that we can cover, we may need to implement a very complex BIST hardware, in order to be able to program at any time after fabrication a large variety of memory test algorithms. The selection of the test algorithm families able to cover a large variety of memory fault models may impact drastically the cost of the BIST hardware. Thus, instead of starting from a large variety of test algorithms and then generate a programmable BIST able to implement these algorithms, we start from a large variety of fault models and we determine a variety of test algorithms which test these fault models and which can be implemented by a programmable BIST of minimum hardware cost.

The most widely adopted memory fault models include stuck-at faults, transition faults, coupling faults, dynamic faults, passive pattern sensitive faults, active pattern sensitive faults (some times also called dynamic pattern sensitive faults), static pattern sensitive faults, and retention faults ("Testing Semiconductor Memories, Theory and Practice", by A. J. van de Goor, John Wiley & Sons publisher, 1991). Excepting the case of retention faults, which require some timing condition to be tested, the detection of any other of the above fault models can be achieved if we are able to provide certain states and perform certain operations over a set of memory cells. For instance, stuck-at faults require to write the 0 (1) state in each memory cell and read the cell. Transition faults require performing the following operations to each memory cell: write 0 (1), write 1 (0), and read the cell. A coupling fault requires setting the coupled cell to a certain value 0 or 1, perform a transition to the coupling cell, and read the coupled cell. Dynamic faults require performing repeatedly some operations on the memory cell.

March test algorithms (SUK D. S., REDDY S. M.—"A march test for functional faults in semiconductor random access memories", IEEE Transactions on Computers, vol. C-30, n° 12 Dec. 1981) are very popular since they are simple and can be used to detect a large number of predominant memory fault models, including memory cell faults such as stuck-at-faults, transition faults, various coupling faults and dynamic faults.

Faults affecting the read/write circuitry and most of decoder faults are also tested by these test algorithms since they can be modeled as cell array faults (NAIR. R THATTE S. M, ABRAHAM J. A. "Efficient algorithms for testing semiconductor Random-Access Memories", IEEE Transactions on Computers, Vol C-27, pp 572–576, June 1978), (THATTE S. M, ABRAHAM J. A., "Testing of semiconductor random access memories" Proc. 7th International Symposium on Fault tolerant Computing, June 1977). More complex algorithms have been proposed for other fault models such as static, dynamic, active and passive pattern sensitive faults.

Memory prototype debugging and failure analysis may require testing the memory with test algorithms able to detect any of these fault models. The variety of the test algorithms that can be used is vast, since the above fault models are numerous, and there are several varieties for some of these fault models. For instance idempotent coupling faults, inverting coupling faults, linked and unlinked coupling faults are some classes of coupling faults (MARINESCU M. "Simple and efficient algorithms for functional RAM testing", IEEE International Test Conference, November 1982.), ("Testing Semiconductor Memories, Theory and Practice", by A. J. van de Goor, John Wiley & Sons publisher, 1991). They correspond to a large number of test algorithms.

Dynamic faults are another example of faults requiring a large variety of test algorithms in order to be tested. For such faults the test algorithm depends on the transistor level design of the memory cell (static cell, dynamic cell, one-transistor cell, two-transistor cell, . . . ), the electrical characteristics of the cell, the type of the defect, and its electrical characteristics. These characteristics lead to a large number of test algorithms for testing dynamic faults. Other fault models can be tuned by several parameters (e.g. the number and location of neighboring cells in neighborhood pattern sensitive faults). They result in several test algorithms for each type of pattern sensitive faults.

Different test algorithms are needed for testing other fault models, such as for instance bit-line couplings, or word-line couplings.

To be able to select during prototype debugging or failure analysis any of these test algorithms, and apply it at-speed, they must be implemented into the BIST hardware. Using a conventional BIST approach for implementing such a large number of test algorithms will result on a huge BIST hardware. In addition, even by implementing such a BIST hardware, the test algorithms that we could use, during debugging and failure analysis, will have to be chosen among the large but still limited number of test algorithms, selected during the BIST implementation. Thus, if we discover during theses tasks that we need to test the memory by some other test algorithms we will not be able to apply them. Programmable BIST is therefore much more adequate in this context, but it may result on a large hardware cost for implementing a large number of memory test algorithm families. It could be thought to be a difficult, indeed impossible task to implement a BIST circuitry able to test the above mentioned fault models, and eventually a larger set of fault models. Clearly no BIST solution has been proposed for solving this difficulty.

To solve this problem efficiently we need to select carefully the test algorithm families, able to offer such large fault coverage. March test algorithms are very popular because they are simple and can detect a large number of predominant fault models such as cell stuck-at faults, transition faults, coupling faults, dynamic faults, faults in the read/write logic, and decoder faults. Due to their simplicity and the coverage of a significant set of fault models, they were selected in our programmable BIST approach.

2. Background-Based Testing

Some complex test algorithms have been proposed for specific fault models, such as pattern sensitive faults. These algorithms can be quite different for different varieties of a given fault model. So, implementing this kind of algorithms in programmable BIST is not a good solution. The invention adopts another approach, which employs simple test algorithms but combines them with a scheme that allows a high flexibility on the selection of data backgrounds used with these algorithms.

A march test algorithm consists of several march sequences.

A march sequence is a test sequence having a very regular structure. It performs at each memory cell the same sequence of read and write operations, using the same data.

Such a sequence addresses the memory cells one after another, following a given addressing order. For each new address, the fixed sequence of operations is performed on the cell selected by this address. This is repeated to all the memory cells. For instance a march sequence can perform the following sequence of operations at each cell ($r_0$, $w_1$, $w_0$, $w_1$, $r_1$). That is, it performs a read 0, a write 1, a write 0, a write 1 and a read 1 before moving to the next cell for performing the same sequence of operations.

A march sequence is defined by the sequence of operations performed on each memory cell, and by the order used for addressing the memory cells, which can be the up or the down order. In fact any addressing order can be selected. However, once this order is selected for a march test algorithm, any march sequence of this algorithm will use this order (up order) or its reverse (down order). We can represent march test algorithms by using the notation proposed in "Testing Semiconductor Memories, Theory and Practice", by A. J. van de Goor, John Wiley & Sons publisher, 1991). Thus, the notation $\updownarrow(w_0); \Uparrow(r_0, w_1, r_1); \Downarrow(r_1, w_0, r_0)$ is a march test algorithm consisting of three march sequences. The first sequence initializes all the memory cells to 0. The addressing order is meaningless in this sequence. The second sequence performs a read 0, a write 1, and a read 1 to each memory cell using an up addressing order. The third sequence performs a read 1, a write 0, and a read 0 to each memory cell by using a down addressing order.

We see that the march test algorithms are very regular, and thus easy to implement. In addition, they detect many predominant memory fault models (e.g. stuck-at, transition, coupling and dynamic faults). This regularity is natural and reflects the fact that each fault in a fault model may affect any of the memory cells. Thus, it is natural to repeat the same operations to each cell, since we need to test the same faults at all the cells. However, this regularity involves an important limitation. Consider a memory cell $c_i$ and a set of memory cells $S_j$. Since, within each march sequence a given write operation writes the same data to all the memory cells, then when, we access the cell $c_i$ at any cycle in the march test algorithm, the state of the cells $S_j$ can have two possible patterns, a pattern A and its inverse $\overline{A}$, where the pattern A is uniquely determined by the position of the cell $c_i$ with respect to the cells of the set $S_j$ within the addressing order of the march test algorithm.

The above limitation was described for bit-oriented memories. In word oriented memories we can use different word values in different march sequences. However, within the same march sequence, we can only use a single word value and its inverse. This constraint results in a similar limitation as with bit-oriented memories.

Due to this limitation, march test algorithms cannot cover fault models involving interactions between more that two cells. Algorithms with more complex structure than march test algorithms are proposed for such fault models. In addition, not only the structure of the algorithm is more complex but also this structure can be very different from one variant of a fault model to another. For instance, Eulerian sequences, Hamiltonian sequences, the tiling methods, the two-group method, etc. ("Testing Semiconductor Memories, Theory and Practice", by A. J. van de Goor, John Wiley & Sons publisher, 1991), have been used to generate test algorithms for different pattern sensitive faults models and different configurations of the neighboring cells. As another complexity, the sequence of operations performed by the test algorithms depends on the physical position of the cells in the memory cell array. This, in case of memories using address scrambling, will require an additional circuit for mapping the logic addressing order generated by the BIST circuit, into the addressing corresponding to the physical positions of the cells, as it can result from the address scrambling.

Clearly selecting this kind of test algorithms will result on complex test hardware and will offer a limited flexibility, since we need a quite different sequencing for each fault model case, which cannot be generalized to cover fault models that were not considered during the BIST implementation.

To cope with these problems, the invention proposes a different approach, which uses programmable march test algorithms combined with programmable data backgrounds. By using a technique that allows a complete data-background flexibility (any data background can be selected for the memory cell array; we obtain a powerful programmable BIST at low cost. Although there is a huge number of possible data backgrounds ($2^N$ data backgrounds for a memory with N cells), the system of the invention maintains low the cost related to the selection of any data background in such a vast data background space.

Let us consider the case of passive neighborhood pattern sensitive faults (PNPSF), to illustrate how works the test approach, which combines adequate march test algorithms with adequate data backgrounds to detect some complex faults. In a PNPSF faults, we cannot perform a transition ($0 \rightarrow 1$, or $1 \rightarrow 0$) on a basic cell, when the set of neighboring cells are in a given state. Since, any of the possible states of the neighboring cells can be on the origin of the fault, we need to test the two transitions $0 \rightarrow 1$ and $1 \rightarrow 0$ of the basic cell for all the possible states of the neighboring cells.

In order to avoid using a complex sequence such as the Eulerian sequence combining with the tiling method for the case of the four cell deleted neighborhood ("Testing Semiconductor Memories, Theory and Practice", by A. J. van de Goor, John Wiley & Sons publisher, 1991), we can determine several data backgrounds that load with all the possible states each of the possible sets of a base cell and its deleted neighborhood. For instance for the four-cell deleted neighborhood we can create 32 backgrounds loading each base cell and its four-cell deleted neighborhood with the 32 possible states (see the above reference). Then, we can load each of these backgrounds in the memory and, for each background, we can execute an algorithm that detects the transition faults. For instance we can execute a test sequence that performs at each memory cell a transition followed by a read. We can see that by repeating this sequence for all the backgrounds and for the two transitions of each cell, we test all the passive pattern sensitive faults. So, each base cell is tested for its two transitions $0 \rightarrow 1$ and $1 \rightarrow 0$ combined with each of the 16 states of its four-cell deleted neighborhood.

We observe that the test sequence performed for each background is a march-like test sequence, since it performs at each cell a transition followed by a read. The difference is that the write operation for performing the transition does not write the same value at each cell. This is because the write value is the inverse of the value loaded in the cell by the given background, which is not constant from one cell to another. The same observation holds for the read values. Thus, we have a greater complexity than in march algorithms, consisting in loading the different backgrounds and controlling the non constant values of the read and write operations. The programmable BIST principle described in the present invention allows doing that with a low hardware cost.

The above principle can be used for the other types of pattern sensitive faults. For instance, data backgrounds combined with march-like algorithms, which detect coupling faults can be used to test active pattern sensitive faults, algorithms detecting stuck-at faults can be used to test static pattern sensitive faults, etc.

Obviously, this principle can be applied for any deleted neighborhood. What is changing for each type of deleted neighborhoods is the set of data backgrounds that we have to load in the memory in order to create exhaustive patterns to the base cell and its deleted neighborhood. For instance, for the eight-cell deleted neighborhood we can use the tiling-2 method or the two-group method for creating the backgrounds "Testing Semiconductor Memories, Theory and Practice", by A. J. van de Goor, John Wiley & Sons publisher, 1991).

The present invention contemplates, by adopting a principle able to program any march test algorithm, to test the fault models involving a single cell (stuck-at faults and transition faults and a subset of dynamic faults), or involving interactions between two cells (coupling faults and remaining dynamic faults). Then, by combining this approach with a technique able to perform these algorithms with any possible background we can test all the known models of pattern sensitive faults, and more generally any fault model involving interactions between more than two cells.

3. Programmable BIST for March Test Algorithms

Previous programmable BIST approaches for memories use a microprogramming architecture. Such architecture requires a memory for storing the microprogram that will perform a given march test algorithm. This memory has a certain hardware cost and in addition the number of march sequences of the march test algorithm is limited by the size of the memory storing the microprogram.

The present invention describes a new programmable BIST architecture, which uses a single instruction per march sequences, loaded by means of a scan path. This eliminates the need for using a specific memory for storing the microprogram, and allows the performance of march test algorithms containing any number of march sequences. Let us consider the following march test algorithm, as an example for illustrating a programmable BIST according to the present invention $\updownarrow(w_0); \Uparrow(r_0,w_1,w_0,w_1); \Uparrow(r_1,w_0,r_0,w_1); \Downarrow(r_1,w_0,w_1, w_0); \Downarrow(r_0,w_1,r_1,w_0);$ We decompose the march test algorithms by using a hierarchical decomposition. In the highest level of hierarchy we have the whole march test algorithm. In the next level we have the march sequences composing it. In the next level we have the addressing order used within the march sequence. Then, we have the number of operations performed at each cell within the march sequence. Finally, at the lowest level, we have the type of each individual operation and the data used by the operation. Our programmable BIST uses this decomposition. It allows a simple representation of the march test algorithms, leading to a simple hardware. The programmable BIST hardware for march test algorithms comprises the following blocks:

a register that holds at any given time an instruction that determines the march sequence under execution;

an address generator that is able to generate all the memory addresses in increasing (up) and decreasing (down) order. This generator can be an up/down binary counter, un up/down LFSR, or any other counter able to generate all the addresses in increasing and decreasing order. A binary counter will be preferred for memories with incomplete address space;

a comparator or a signature analyzer for test response verification;

a controller that sequences the operation of the BIST hardware;

a data register (to be used only in word-oriented memories) in which we load the data word to be used during a march sequence.

The instruction determining the current march sequence can comprise, in particular, the following fields:

An up/down field (U/D). This is a single-bit field. It determines the address order to be used during the march sequence, A march sequence size field (NO). It determines the number of operations performed during the current march sequence. This field has $\lceil \log_2 m \rceil$ bits, where m is the maximum number of operations of that march sequence, allowed by a given implementation of our programmable BIST. In our convention, the binary value 0 of this field will determine that we will execute a single operation in the march sequence (the operation O0). The binary value t of this field determines that we will execute t+1 operations during the march sequence, m operation fields (O0, O1, . . . Om−1). They determine the type of each individual operation of the march sequence. Each operation field will be a single-bit field if we want to implement only march sequences using two types of operations (write and read). It will have more than one bit if we want to implement march sequences using more that two operations (e.g. read, write, and read-modify-write), m polarity fields (P0, P1 . . . Pm−1). Each polarity field is a single-bit field. It determines the polarity of the data to be written in the memory during a write, and the polarity of the data expected to be read from the memory during a read. The polarity for the read data is used if the rest response evaluation is done by a comparator. In bit-oriented memories, the polarity bit is equal to the value of the data bit. In word-oriented memories, a separate field holds the word data used during the current march sequence. The polarity bit determines at each cycle of the current march test algorithm if this word data is used in its direct or complemented form. Only the contents of the first t+1 pairs of operation and polarity fields are meaningful during the current march sequence, where t is the binary value specified in the field NO. The values of the fields Ot+1 . . . Om, Pt+1 . . . Pm, are don't care, since only t+1 operations are performed during the current march sequence.

A data word field (Data). This field is used for word oriented memories only. It determines the value of the word to be used (in its direct or complementary form) during the march sequence.

A wait field (W). This is a single-bit field. It determines if the operations (e.g. read, write) specified in the operation fields have to be executed during the present march sequence, or if instead, this operations will be replaced by non-operation (or idle) cycles. This field is optional and is used if the programmable BIST has to offer the option of retention fault testing. This field is used for implementing a march sequence composed only of wait cycles. However, for march test sequences where only some cycles are wait cycles, each wait cycle is considered as an operation, the non-operation, and is coded within the respective operation field.

An address mode field (@mode). It is used to specify the mode of the address Counter, if the address Counter has some other modes in addition to the up and down modes.

A test end field (TE). This field is a single-bit field. It determines if the current march sequence is the last sequence of the test algorithm. So, at the end of a march sequence having its TE field active, the BIST controller activates the march test algorithm completion signal. The value of the TE field does not necessarily need to be loaded in the last bit of the struction. It can be loaded in the place of the Ot+1 bit, where t is the value of the NO field. The TE field is optional, because our BIST hardware generates a signal (the LM signal), which signals the completion of each march sequence. Since the global test controller of the chip knows that the BIST executes its last march sequence, it can use the march sequence completion signal LM, generated during the last march sequence, as the march test completion signal.

DETAILED DESCRIPTION OF THE INVENTION

In the following, we will consider in more detail three aspects of the invention:

a programmable BIST system (part 1),
a background programming scheme (part 2),
an address programming scheme (part 3).

1. Programmable BIST system

Figure 1:
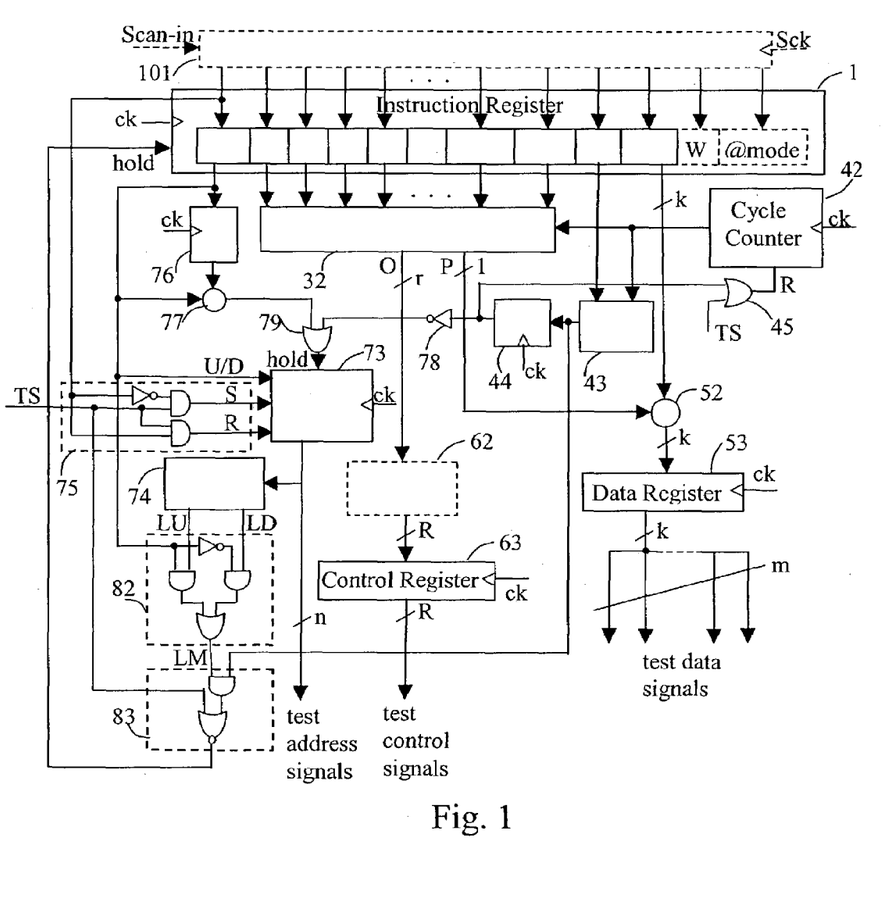
FIG. 1 illustrates an embodiment of a programmable BIST system according to the present invention.

FIG. 1 illustrates an embodiment of a programmable BIST system according to the invention for testing a memory 200.

An instruction register 1 holds the current instruction that determines the current march sequence. An Address Counter 73 generates an address sequence in the up or down order as specified by an U/D field of the instruction register. During each clock cycle of the test process, the Address Counter provides on its outputs the address of the current memory operation. The size of the Address Counter is equal to the number n of the address bits of the memory. The Address Counter can be implemented by any sequential circuit able to generate on a set of n signals all the possible $2^n$ binary values. The Address Counter generates these values at a first order (up order), or at a second order (down order) which is the reverse of the first order. We can use for instance an up-down binary counter, an up-down LFSR, an up-down Gray code generator, etc. However, when the memory is incomplete, that is, it uses only a subset of the possible $2^n$ address values to select all the existing memory locations, a binary counter is more convenient since it will address at a first time the existing memory locations. Thus, a circuit decoding the maximum address of the actual memory location can be used to stop the current march sequence when all the actual memory locations have been tested.

During each write operation of the test process, a Data Register 53 provides on its outputs the data to be written in the memory. During each read operation of the test process, register 53 provides the data value expected to be read from the memory. This data value is compared through a comparator 100, against the actual data value read from the memory 200 to verify its correctness. Another possibility is to verify the read data by using a signature analyzer. In this case the values present on the outputs of the Data Register during the read operations are useless. Very often the data words used in memory testing have a periodic structure. In this case the Data Register can have a number k of bits, which is lower than the number w of bits of the memory words. The k bits of the Data Register 53 will be expended into w bits as shown in FIG. 1. Also, in this case, the Data field of the Instruction Register 1 will have k bits only.

A Control Register 63 provides during each cycle of the test process the control signals that determine the operation to be executed by the memory (e.g. a read, a write). The binary values used to code the memory operation in the operation fields of the Instruction Register can use the same coding as the control signals of the memory. For instance, for a memory having a R/W and a "Memory Enable" control signal, R/W=1, "Memory Enable"=1 may code a read cycle, R/W=0, "Memory Enable"=1 may code a write cycle, and R/W=x, "Memory Enable"=0 may code a cycle with no memory access. In this case, we can use two bits per operation field of the instruction register and use the same coding as the control signal of the memory, for the read operation, the write operation and the non operation. It is also possible to use another coding. For instance, it is possible to code only the read and write operations in the operation fields of the Instruction Register. Thus, we will use a single bit per operation field. In this case the operation code O selected by a MUX 32 must be modified to generate the actual coding of the memory control signals. A Formatting block 62 is used in this case to perform this modification. Another problem concerns the timing characteristics of the address, the data, and the control signals of the memory. It may be necessary to modify the BIST hardware in order to conform to the timing constraints of each memory design. These aspects are not considered here. However, the hardware implementation presented in FIG. 1, provides to the memory under test, address, data, and control signals that are ready from the beginning of each clock cycle. Thus, they should conform a majority of memory designs.

The Address Counter 73, the Data Register 53, and the Control Register 63, are not specific to this invention. They are necessary for any memory BIST scheme. A Decode Logic 74 decodes the last address of the up sequence of the Address Counter 73 and the last address of the down sequence of the Address Counter 73, and activates respectively signals LU and LD when these addresses occur. In this example we consider the value 1 as the active value of these signals. The Decode Logic 74 also is not specific to this invention, since all BIST controllers need a signal indicating if all the addresses of the memory were visited by the current march sequence, in order to start executing the next march sequence.

A Cycle Controller 30 comprises the multiplexer 32, the cycle counter 42, a comparator 43, a flip-flop 44 and an OR gate 45 connected as explained below. During t+1 consecutive cycles, the successive values of the first t+1 operation fields of the Instruction Register 1 are provided at an output O of the MUX 32, and the successive values of the first t+1 polarity fields of the Instruction Register 1 are provided at an output P of the MUX 32. The Cycle Controller repeats the above operation for each address generated by the address counter 73. The binary counter 42 counts during t+1 cycles from 0 through to t, where t is the value stored in the field NO of the Instruction Register 1. The outputs of the binary counter 42 control the multiplexer 32 having m sets of inputs coming from the m operation fields of the Instruction Register 1, m sets of inputs coming from the m polarity fields of the Instruction Register 1, one set of outputs O and a second set of outputs P. The multiplexer 32 is designed so that, when the outputs of the binary counter provide the binary value i, the multiplexer provides to its set of outputs O the values of the field Oi of the Instruction Register 1, and to its set of outputs P the values of the field Pi of the Instruction Register 1. The comparator 43 compares the value stored in the field NO of the Instruction Register 1 against the value present on the outputs of the binary counter 42. When the comparison matches the output of the comparator is activated high. This signal indicates the completion of the test operations over the current address. The D flip-flop 44 delays the output of comparator 43. The output of flip-flop 44 initializes the binary counter 42 to the 0 binary state. A second signal TS can be combined with the output of flip-flop 44, by means of a logic gate 45, to generate the signal that initializes the binary counter 42. The signal TS can be generated by a system external to the BIST circuitry (e.g. by the global test controller of a system on a chip (SOC)), which sets the signal TS to 1 during a clock cycle, to activate the BIST hardware.

The clock of the Address Counter 73, counts once every t+1 clock cycles, where t is the binary value stored in the NO field of the Instruction Register 1. The contents of the Address Counter are hold unchanged during t clock cycles where t is the binary value stored in the NO field of the Instruction Register. The Address Counter 73 is controlled by a Hold signal. When the signal Hold is active during a clock cycle, then, during the subsequent clock cycle the state of the Address Counter will be unchanged. According to an aspect of the present invention, the said Hold signal is generated by means of comparator 43 and counter 42. The comparator 43 compares the outputs of the counter 42 against the value stored in the NO field of the Instruction Register 1. When the comparison does not match, the comparator provides on its output the active level of the Hold signal, and when the comparison matches it provides on its output the non active level of the Hold signal. The Hold signal of the Address Counter 73 is generated by using flip-flop 44 to delay the output of the comparator 43 during one clock cycle. The output of the comparator is eventually inverted by an inverter 78. The state of the Address Counter is hold unchanged when the value stored in the U/D field of the Instruction Register 1 during the present clock cycle is different from the value stored in this field during the previous clock cycle. The value stored in the U/D field of the Instruction Register 1 is loaded to a flip-flop 76 at each clock cycle. An EXCLUSIVE OR gate 77 receives the input and the output of flip-flop 76. The active level (i.e. the level 1) activates the Hold signal of the Address Counter. A logic circuit 79 combines the signal generated by the flip-flop 76 and the XOR gate 77 with the signal generated by the Counter 42, the comparator 43, the flip-flop 44 and the inverter 78, to generate the Hold signal.

As we have seen, in march test algorithms, the memory can be addressed in two possible orders, up and down. The order (up or down) on which the addresses of the memory are generated during the test phase is determined by the contents of the U/D field of the Instruction Register 1. An input of the Address Counter 73, said the U/D control input of the Address Counter, determines in which order the Address Counter generates the memory addresses. The output of the U/D field of the Instruction Register controls the said U/D control input of the Address Counter.

According to an embodiment of the present invention, the contents of the Address Counter 73 are initialized at the beginning of the test session, when the Instruction Register is loaded for the first time. The Address Counter is initialized to the first address of the up address sequence if the value loaded in the U/D field of the Instruction Register codes the up addressing order (e.g. value 1), and is initialized to the first address of the down address sequence if the value loaded in the U/D field of the Instruction register codes the down addressing order. The test session is activated by activating during one clock cycle a control signal TS (e.g. the value of TS is set to 1). A logic circuit 75 combines the signal TS and the content of the U/D field of the Instruction Register 1, and generates a first signal R that forces the Address Counter 73 to the first address of the up address sequence and a second signal S that forces the Address Counter to the first address of the down address sequence.

The Instruction Register 1 is loaded once at the beginning of the test session and once each time the Address Counter provides at its outputs the last address of the address order determined by the value stored in the U/D field of the Instruction Register 1 and at the same time the state of counter 42 matches the value stored in the NO field of the Instruction Register. The contents of the Instruction Register 1 are hold unchanged during $(t+1)2^n-1$ clock cycles, where t is the binary value stored in the NO field of the Instruction Register and $2^n$ is the number of addresses of the memory under test. The Instruction Register 1 is for example controlled by a hold signal to be said the hold signal of the Instruction Register. When this signal is active during a clock cycle, then, during the subsequent clock cycle the state of the Instruction Register will be unchanged.

According to an embodiment of the present invention, the Decode Logic circuit 74 generates a first signal LU that is active when the last address of the up address sequence is present on the outputs of the Address Counter 73, and a second signal LD that is active when the last address of the down address sequence is present on the outputs of the Address Counter 73. A logic circuit 82 combines the outputs LU and LD of the logic circuit 74, with the output of the U/D field of the Instruction Register 1 to generate a signal LM that is active only when the Address Counter 73 provides the last address of the address sequence order specified by the value stored in the U/D address field of the Instruction Register 1. A logic circuit 83 combines the signal LM generated by the logic circuit 82 with a control signal TS, which activates the test phase, and with the output of a comparator 43 that compares the value stored in the NO field of the Instruction Register 1 against the outputs of counter 42, to generate the said hold signal of the Instruction Register.

The Instruction Register 1 may include a wait field W. The inactive value (e.g. value 0) of this field leaves the BIST hardware to provide on the control signals of the memory values corresponding to the operations specified in the operation fields of the Instruction Register 1. The active value of the wait field W of the Instruction Register 1 (e.g. the value 1) forces the BIST hardware to provide on the control signals of the memory under test a value that corresponds to a non operation cycle of the memory. For instance, if the memory uses a "Memory Enable" signal such that the value "Memory Enable"=1 allows the memory to perform the operation specified in the R/W signal, while the value "Memory Enable"=0 forces the memory in a non operation (or idle) cycle, then, the active value of the wait field of the Instruction Register 1 will force the "Memory Enable" signal to the value 0. The value stored in the wait field W of the Instruction Register 1 and the values stored in the operation fields of the Instruction Register are combined to provide the actual values of the control signals of the memory under test. The function of this circuit is such that the active value of the wait field W of the Instruction Register 1 forces the control signals of the memory under test to the state that determines a non operation (or idle) memory cycle.

In addition to the march test algorithms, the BIST system according to the present invention can be used to program wait phases of any given duration for detecting retention faults. This can be done by loading the Instruction Register several times with well selected values of the NO field and the W field. To force the memory on a wait cycle (i.e. a cycle where no operations are performed on the memory) of a time duration $D_r$, $Q_1$ test sequences are repeated, each of this sequence being specified by loading the Instruction Register 1 with values such that the field W is loaded with its active value and the field NO is loaded with the binary value $2^s-1$, followed by a test sequence specified by loading the Instruction Register 1 with values such that the field W is loaded with its active value and the field NO is loaded with the binary value $Q_2$, where s is the number of bits of the field NO of the Instruction Register 1, $Q_1$ is the quotient and $R_1$ is the rest of the division of $D_r$ by $T_{ck} \times 2^s \times N_a$, $N_a$ is the number of the memory addresses, $T_{ck}$ is the clock period, $Q_2$ is the quotient of the division of $R_1$ by $T_{ck} \times Na$.

The Address Counter 73 can be implemented to have different operation modes, in addition to the up and down modes. For instance, the addresses in the up mode can be generated by using the column address bits as the LSB bits of the Address Counter and the row address bits as the MSB bits of the Address Counter. In this case, for a given value of the row address bits, all the values of the column address bits are generated before generating a new value in the row address bits. Another possibility is to use the row address bits as the LSB bits of the Address Counter and the column address bits as the MSB bits of the Address Counter. In order to be able to generate the address sequences in any of the above two modes, we can use a multiplexer which connects the outputs of the Address Counter to the address bits of the memory following the one or the other of the above connections according the values applied on the control signals of the multiplexer. Another possibility is to implement two counters, a column address counter for generating the values applied on the column address bits and a row address counter for generating the values applied on the row address bits. To implement the case where the column address bits are the LSB bits of the Address Counter, a signal detecting the 11 . . . 1 state in the column address counter will be used to activate the row address counter each time the column address counter is full. A similar connection can be used to implement the case where the row address bits have to be the LSB bits of the Address Counter. The memory can be organized in columns, rows, and blocks, and have column address bits, row address bits, and block address bits. As in the previous case, we can have the column address bits as the less significant bits of the Address Counter, the row address bits as the mean significant bits of the Address counter, and the block address bits as the most significant bits of the Address Counter, or having any of the other 5 possible permutations for these bits. Again we can implement the Address Counter to allow any of these modes and use some control bits to determine which of these configurations is used at any given time. Other address generators modes can also be used. For instance the addresses can be generated in a step mode where the state of the Address Counter is increased (in up mode) or decreased (in down mode) by a constant value c. This can be done by implementing the Address Counter as an accumulator and applying the constant c on the one input of the accumulator. The constant c can be programmed to allow a high flexibility. If the Address Counter is composed of several smaller counters as described above.(e.g. column address counter, row address counter, . . . ), each of these counters can be implemented to perform the step mode.

The Address Counter 73 can be implemented to have various operation modes in addition to the up and down modes. The selection of the operation mode of the Address Counter 73 is performed by means of a set of control bits.A @mode field (to be said the address mode field) is added to the Instruction Register 1. The value stored in the @mode field of the Instruction Register 1 determines the values of the control signals that select the operation mode of the Address Counter.

To start the march test algorithm we load in the Instruction Register 1 the instruction corresponding to the first march sequence of the march test algorithm. This is done by activating the signal TS during one clock cycle. Then, at the end of the first march sequence, we load the second instruction to the Instruction Register. This instruction corresponds to the second march sequence of the march test algorithm. The load is activated automatically by the BIST hardware at the end of the first march sequence, but the second instruction must be present on the inputs of the Instruction Register 1 at the end of the first march sequence, Another possibility is to activate the loading by a signal generated by a circuit external to the BIST as was done for loading the first instruction. This process will be repeated as many times as the number of sequences of the march test algorithm. The instructions will be applied to the inputs of the Instruction Register by another circuit, for instance by a memory in which the instructions where stored previously. An interesting characteristic of the programmable BIST according to the present invention is that it uses only one instruction per march sequence. Thus, we can use a scan path 101 to shift the first instruction into the inputs of the Instruction Register 1, and activate the TS signal to load it in the Instruction Register. Then, during the period of time that the BIST executes the first march sequence, we can use the scan path 101 to shift the second instruction into the inputs of the Instruction Register 1. This instruction will be maintained at the inputs of the Instruction Register 1 until the end of the second march sequence, where it will be loaded in the Instruction Register 1. The signal that enables the loading of the instruction Register can be monitored by the system that controls the scan path 101 or by decoding elements of circuit 83. Thus, when the second instruction is loaded in the Instruction Register the third instructions starts to be shifted through the scan path, and so on until the end of the test algorithm. Thus, the use of the scan path avoids the implementation of a memory for storing the instructions, and allows to program march test algorithms having any number of march sequences, while the use of a memory for storing the instructions limits the number of march sequences to the number memory words. This use of a scan path is not possible with the existing schemes of programmable BIST, since these schemes use a micro-programmable approach, where the frequent use of different microinstructions do not leave enough time for shifting them through a scan path. Note that in FIG. 1 we have used two different clock signals. The signal ck is used for the blocks of the BIST hardware. This hardware is implemented in the same chip as the memory, so it can be run at the same speed as the memory and the other blocks of the chip. Thus we can use the same clock for the BIST hardware and the other blocks of the chip. On the other hand, the signals shifted through the scan path can come from the board. In this case the scan path, which can be a simple shift register with a serial input and a parallel output, will be operated by a slow clock signal. Thus, in FIG. 1 we use a different clock signal for the scan path 101, the signal Sck.

We have seen that the programmable BIST described in this invention allows to program march test algorithms using any number of march sequences and any combination of operations within each march sequence. The only limitation concerns the maximum number of operations performed within a march sequence. This number is limited by the number m of the operation fields of the Instruction Register 1. However, all the known march test algorithms are composed of march sequences that use a small number of operations. Also, the cost of the hardware implementing the programmable BIST described in this invention is low. In addition, an increase of the number of the operation and polarity fields of the Instruction Register will only increase the hardware for implementing the Instruction Register 1 and the multiplexer 32. Thus, we can implement a programmable BIST with a number of operation and polarity fields higher than any practical test algorithm, by paying a very low hardware cost. For instance by using 16 operation and polarity bits, we will use 32 bits in the Instruction Register 1 for these fields and we will also use a multiplexer 32 with 32 inputs and 2 outputs (in fact we will use two 1-out-of-16 multiplexers). Such an implementation covers all practical march test algorithms since the existing ones use few operations within the march sequences (one, two, three or four operations in most cases). In addition, with the programmable BIST proposed in this invention, any wait time for testing retention faults can be programmed.

2. Background Programming

An important limitation of the march test algorithms is the use of a single data word and its reverse during each march sequence. An important aspect of the present invention concerns the capability of a programmable BIST to use any test data during any cycle of the test process. However, such flexibility may require a large amount of test data and thus a large amount of memory for storing them. Implementing a BIST with such a large memory will require a very high hardware cost. To achieve this goal, at low cost, it is proposed to use the external test equipment for providing the test data to the memory under test.

There are two conventional ways to apply test data to an embedded memory. The first way uses a scan path and shifts the test data provided by the test equipment into the data inputs of the memory. However this requires a large number of shifts for applying each test data. It makes impossible to perform an efficient test, which will require applying one test vector per clock cycle. The second way is to create a direct connection between the circuit pads and the memory inputs. This can be done for instance by using some multiplexers. Thus, the external test equipment will be able to apply one test data per clock cycle. However, this test cannot be done at the normal operation speed of the memory, since the test data come from the board, and thus are much slower than the internal signals of an integrated circuit. One of the goals of the present invention is to conciliate the high flexibility offered by an external test approach with the test application at high speed offered by a BIST approach.

According to the present invention, the test data are provided by an external test equipment during a first phase and the test algorithm is performed by the BIST hardware during a second phase. During the first phase, the test equipment provides the test data by means of a serial access mechanism (i.e. a scan path) or by means of a parallel access mechanism. This phase is eventually performed at low speed. Since the test data provided during the first phase will be used as test data during the second phase, they have to be stored in the chip. In the worst case, we need a memory as large as the memory under test to store these data. There are two memories in the chip, memory 1 and memory 2, memory 2 being the memory 200 to be tested. The test data are stored in memory 1 during the first phase. During the second phase, we test the memory 2 by reading the data stored in memory 1 and using them as test data for memory 2. This will be done as following: we perform two algorithms in parallel on the two memories. The algorithm performed on memory 2 is the test algorithm. The algorithm performed on memory 1 (the data source algorithm) can be derived from the test algorithm as follows:

The data source algorithm performs a read operation at each cycle the test algorithm performs a read operation. The read of the test algorithm and the read of the data source algorithm are performed over the same addresses. The data read in the data source algorithm will be used as a reference to check if the data read in the test algorithm are correct. However, if the read data are verified by means of a signature analysis such a reference is not necessary. In this case we do not need to apply the present rule, and instead of a read we can perform a non-operation in the data source algorithm.

The data source algorithm performs a read operation at any cycle preceding a cycle that the test algorithm performs a write operation. The read in the data source algorithm will be performed on the same address as the write in the test algorithm.

At any other cycle the data source algorithm performs any operation that does not modify the state of the addressed location (e.g. a read, a write using as data the content of the addressed location, or a non operation).

The rules 1 and 2 are conflicting if the test algorithm performs at some time a read over a memory location followed by a write over a different memory location. For instance if the test algorithm performs at cycle i a read over a cell C1 and at cycle i+1 a write over a cell C2, then from rule 1 the data source algorithm must perform a read of the cell C1 at cycle i, and from rule 2 the data source algorithm must perform a read over the cell C2 again at cycle i. As a matter of fact, for algorithms in which the above conflict occurs, we eliminate the rule 1 by using a signature analyzer to verify the read. For algorithms where this conflict does not occur we can use either a comparator or a signature analyzer for verifying the read data. However, since we consider a programmable BIST approach for which any test algorithm must be covered, we will implement the present scheme by using a signature analyzer for verifying the read data. In this case, we can create the data source algorithm by using the rules 2 and 3.

A simpler way is to start performing the data source algorithm one cycle before the test algorithm. In this case we can create the data source algorithm in a much simpler manner. For doing so we will replace each write operation of the test algorithm by a read, while the read operations are mentioned. This rule can be applied to any algorithm and can be used with both the scheme performing read data verification by using a signature analyzer, and the scheme performing this verification by using a comparator. Thus, this scheme is simpler and is applicable in all situations. Instead of deleting by one cycle the test algorithm with respect to the data source algorithm, a shift of a portion of a cycle can be used in specific implementations.

Figure 2:
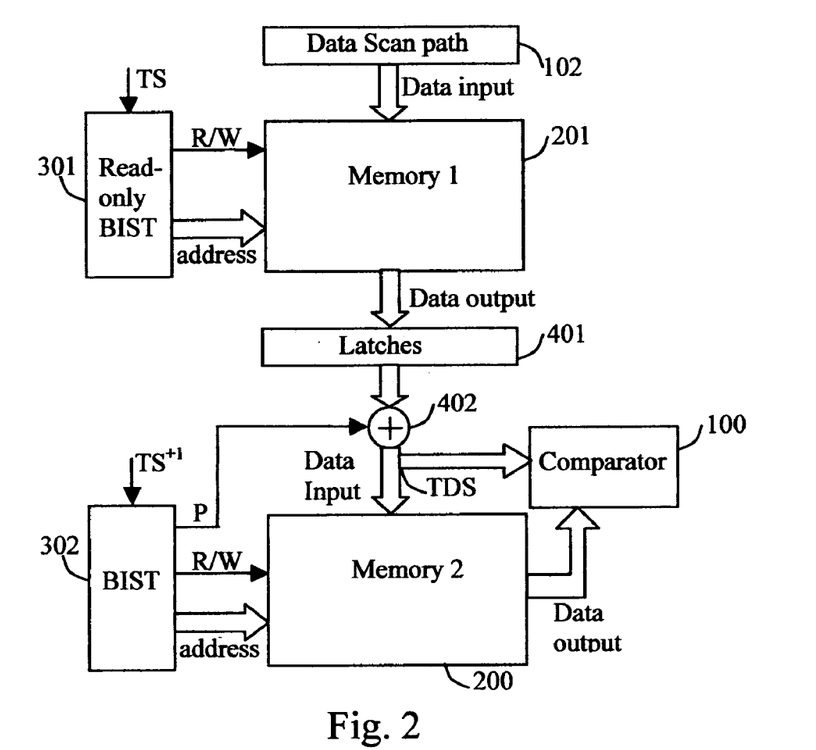
FIGS. 2 to 5 illustrate alternative embodiments of circuits for generating test data backgrounds.

FIG. 2 illustrates an exemplary embodiment of the invention using the scheme. The test data are loaded to a first memory (memory 1) 201, during a first phase (the data load phase). Some access means such as a scan path chain 102 can be used to facilitate the transfer of the test data to the inputs of the memory 1. The memory 200 to be tested (memory 2) 200 is tested during a second phase (the test phase), by means of a test algorithm. During the test phase, the BIST hardware 301 of memory 201 (said read-only BIST) is programmed to perform an algorithm obtained by replacing each write operation of the test algorithm by a read operation. The BIST hardware 302 of memory 200 (said BIST) is programmed to perform the test algorithm. The read-only BIST 301 of the memory 201 is activated at cycle 0 by means of a control signal TS. The BIST 302 of memory 200 is activated one cycle later than the read-only BIST 301 of memory 201, by means of a signal $TS^{+1}$. The data read from memory 201 at any cycle are stored in a set of latches 401. The data stored in this set of latches are applied on the inputs of a set of EXCLUSIVE OR gates 402. Each XOR gate of the set of XOR gates 402 receives a first input from the output of a latch of the set of latches 402 and a second input from a polarity signal P generated by the BIST 302 of memory 200. During a write operation to be performed over memory 200, the outputs of the XOR gates 402 provide the data values to be written in memory 200. During a read operation to be performed over the memory 200, a comparator 100 compares the data read from memory 200 against the outputs of the set of XOR gates 402, to check the correctness of the read data.

The above process can be repeated by exchanging memory 1 and memory 2, in order to perform the test algorithm over memory 1.

When there is only one memory in a system, we can partition the memory in two blocks and implement them in a manner that allows operating the two blocks as independent memories. That is, during normal operation the two blocks can be used as a single memory, and during test the two blocks can be used as two independent memories. Thus, the BIST scheme described above can be used for this memory.

The BIST block 302 and the read-only BIST block 301 can be merged into a single block. For doing so, we implement only the BIST block 302 and we add a stage of latches between the outputs of this block and memory 2 (200). At the same time, we supply directly to memory 1 (201) the address signals, the MEM enable signal and the R/W signals generated by the BIST block (i.e. without passing through the stage of latches). But we modify the R/W signal to activate only read operations in memory 1 (201).

Figure 3:
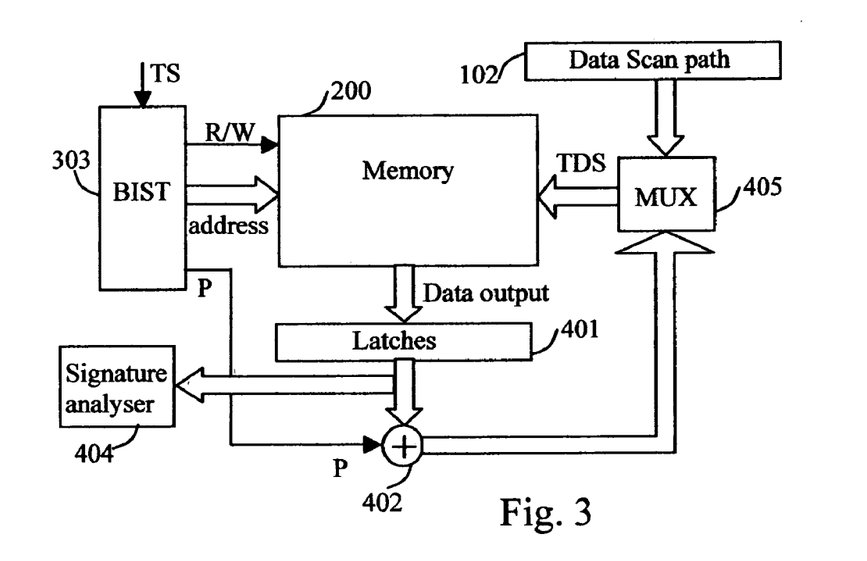

Another solution for using as test data for a memory the data supplied by an external test equipment at a low speed, and at the same time perform the test of the memory at a high speed, consists of using a first phase (the data load phase) during which we load the test data in the memory, and a second phase (the test phase) during which we test the memory by using as test data the contents of the memory itself. According to this technique we transform each test algorithm into an algorithm that allows using the memory data as test data. This is done thanks to the following transformation. We add a read operation at the beginning of each set of successive read and write operations performed over the same memory location and starting by a write. Thanks to this transformation, each set of consecutive operations performed over the same memory location start with a read. The data read from the memory at any cycle are stored in a latch. During any write, we use as data to be written in the memory the data stored in this latch, eventually by inverting them. FIG. 3 illustrate this scheme. Note that the transparent BIST approach adds some operations at the end of the test algorithm in order to recover at the end of the test process the initial state of the memory. This goal is not of interest for the present invention. So, we will use only the transformation described above.

FIG. 3 illustrates another embodiment of the present invention. The test data are loaded in the memory 203 by means of a test access mechanism 102 during a first phase. The BIST hardware 303 is programmed to perform a test algorithm in which each set of consecutive memory operations performed over the same memory address starts by a read. The data read from the memory 203 at any cycle or at some specific cycles are stored in a set of latches 401. The data stored in this set of latches are applied on the inputs of a set of XOR gates 402. Each XOR gate 402 receives a first input from the output of a latch of the set of latches 401 and a second input from a polarity signal P generated by the BIST hardware 303. During a write operation performed over the memory 203, the outputs of the XOR gates 402 provide the data values to be written in the memory 203. The data read from the memory 203 at any read cycle are injected to a signature analyzer 404, which is used for verifying the correctness of the read data.

As an alternative to the use of a signature analyzer, two memories are tested concurrently by means of a first phase that loads the test data to each of the memories, and by means of a second phase that applies a test algorithm to each memory, which uses the data loaded in each memory as test data for that memory as described above. According an aspect of the present invention, the data read from the two memories at any cycle are compared against each other for checking their correctness.

As another alternative to the use of a signature analyzer, we can use a comparator that verify the read data at every t cycles, where t is the number of BIST clock cycles required to shift through the scan path a data word. Then, we repeat the test t times. The first time, we scan and check through the comparator the data read during the 1, t+1, 2t+1 . . . cycles. The second time, we do the same for the 2, t+2, 2t+2 . . . cycles. The $t^{th}$ time, we do the same for the t, 2t, 3t . . . cycles.

We can load the test data to the memory under test by means of a test access mechanism such as a scan path chain, and then use the BIST circuitry for applying a test algorithm, which uses the loaded data as test data. We can load and test the memory several times, in order to test it for several data backgrounds. We can use for that any data background of our choice. For instance he can use the tiling method to determine several data backgrounds that load all the possible patterns to the four up, down, left and right neighboring cells of each memory cell, or to load the memory with another set of data backgrounds that load all the possible patterns to the eight neighbors of each cell, as described in the book entitled "Testing Semiconductor Memories, Theory and Practice", by A. J. van de Goor, John Wiley & Sons publisher, 1991. By comparing these backgrounds with selected march test algorithms, we can test important classes of fault models, such as for instance the various classes of neighborhood pattern sensitive faults. If we use a scan path chain for loading the backgrounds, we have to convert each background into a serial string that will be transferred to the inputs of the memory via the scan path. In memories using address scrambling, we can consider the relationship between the physical location of the memory cells and the logical location within the address space. This allows the loading of the memory with the adequate backgrounds without using the hardware block that employs the existing BIST approaches, in order to translate the logical address order generated by a BIST hardware to the physical address order corresponding to the physical location of the memory cells.

Beyond the significant advantages of this solution, a drawback concerns the long time required for loading the data backgrounds through a scan path. To reduce this time, we can use various techniques. The first technique considers the existence of a periodic structure in the data words used in many data backgrounds. Thus, for a memory using words of m bits, some backgrounds can use words having a period of k bits. In this case, we transfer through the scan path k bits in the place of each word of m bits, and we expend these k bits into a word of m bits, similarly to the expansion shown in FIG. 1. This reduces by a factor of m/k the number of bits to be transferred through the scan chain.

We can obtain a further reduction of the time involved by the data background loading, by exploiting a periodicity of the words used in many backgrounds. For backgrounds that repeat periodically the same data words, with a period equal to q, we can use an auxiliary memory having q words and load on this memory the q words forming the period of the background.

Then, by reading repetitively the q words of the auxiliary memory, and writing them in the memory under test, we can load the latter with a data background having a period of q words. We can combine this technique with the technique using words of k bits instead of m bits. This scheme is illustrated in FIG. 4.

Figure 4:
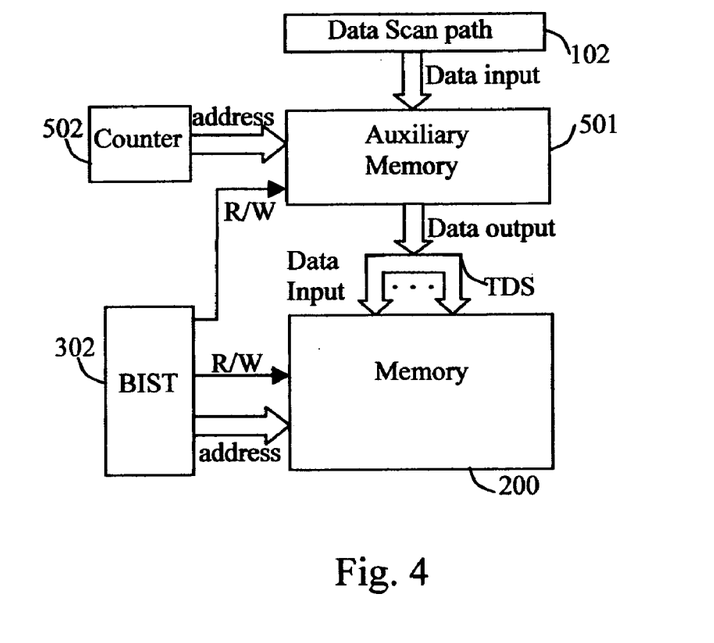

FIG. 4 illustrates an embodiment of the present invention, using an auxiliary memory 501 composed of q words of k bits. During a first phase, the auxiliary memory is loaded with a set of q words of k bits each, by means of a test access mechanism 102 (e.g. a scan path). During a second phase, a counter 502 generates repetitively all the q addresses of the auxiliary memory 501, and a read operation is performed over each address of the auxiliary memory 501 generated by the counter 502. The k bits of the data read are expended to form words of m bits. At the same time, the BIST hardware 302 generates all the addresses of the memory under test 200, and at each cycle the expended form of the data read form the auxiliary memory 501 during the previous cycle is written in the memory under test 200. The counter 502, generates repetitively the addresses of the auxiliary memory as many times as necessary for loading all the locations of the memory under test 200 with the data read from the auxiliary memory.

Another possibility is to consider the number of words included in various backgrounds of interest. If Mb is the maximum number of words including at any of these backgrounds, we can implement an auxiliary memory with Mb words. Then, to load a background in the memory under test, we first load all the words of the background in the auxiliary memory, and then we load the background to the memory under test by using the words loaded in the auxiliary memory. However, the words of the auxiliary memory can be placed within the background in a rather arbitrary manner. In this case we will use the scan path to address the auxiliary memory, in order to read the words of this memory in the order required for writing them in the memory under test. With this scheme we will need a number of $\lceil \log_2 q \rceil$ shifts for writing each word of the background in the memory under test. This scheme is illustrated in FIG. 5.

Figure 5:
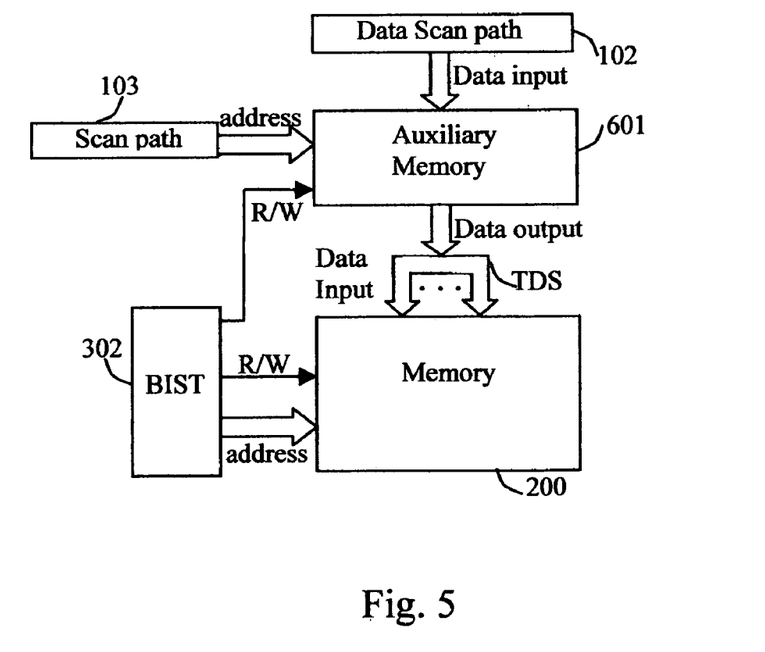

FIG. 5 illustrates another embodiment of the present invention, using an auxiliary memory 601 composed of q words of k bits. During a first phase, the auxiliary memory is loaded with a set of q words of k bits each, by means of a test access mechanism 102 (e.g. a scan path). During a second phase, a second access mechanism 103 (e.g. a second scan path) is used to address the auxiliary memory at a desired order, and at each cycle a data is read from the address of the auxiliary memory 601 that is provided by the second access mechanism 103. The k bits of the data read are expended to form a word of m bits. At the same time, the BIST hardware 302 generates all the addresses of the memory under test 200, and at each cycle the expended form of the data read form the auxiliary memory 601 during the previous cycle is written in the memory under test 200. The process is repeated as many times as necessary for loading all the locations of the memory under test 200 with the data read from the auxiliary memory.

The scheme using the scan path for writing the words of the background directly in the memory under test offers the highest flexibility, but requires the longest time for loading the backgrounds. This technique will be very desirable for debugging of new memory designs and for failure analysis, where the test time is not an important constraint and at the same time a high flexibility is required. On the other hand, test time reduction is a prime requirement in other situations such as manufacturing testing. The techniques proposed for reducing the loading time will be essential in this case. In order to be able to choose the highest flexibility of the one method or the lower test time of the others, we can implement several of the solutions in a given design.

A last problem concerns the verification of the data read from the memory during the test phase. For doing this verification, we can use a signature analyzer as for the scheme of FIG. 3. Another possibility is to use a comparator. In this case, during a read, we will also read the location of the auxiliary memory, in which we have stored the corresponding word, and we will use the comparator to compare the word read from the memory against the word read from the auxiliary memory, after expansion of the latter. This approach requires addressing the adequate location of the auxiliary memory at each clock cycle. One option is to use a dedicated address generator. This generator can be quite simple if the address generator of the main memory addresses the memory words in an order that results on a periodicity in the data values read from the memory. Another option is to use some of the address bits generated by the address generator to address the auxiliary memory. These bits can be used directly or after some transformations. This option works efficiently in most situations using periodic data patterns in the memory, since a few column and row decoder address bits determine this periodicity. So, each value of these bits may determine words in the main memory and in the auxiliary memory storing the same data value.

The invention claimed is:

1. A programmable built in self test, BIST, system for testing a memory, comprising:
    an instruction register formed in the same chip as the memory;
    means for loading said register with successive instructions, each instruction comprising:
        at least one address control field,
        a first number, m, of operation fields O0-Om-1,
        a number-of-operations field NO specifying a second number t+1, specific to each instruction with t+1≦m;
    means controlled by the address control held to determine successive addresses; and
    a cycle controller for executing, for each successive address, said second number t+1 of successive operations, each of which is determined by one of the t+1 first operation fields.

2. The BIST system of claim 1, wherein each instruction further comprises m polarity fields, and the system comprises means for inverting or not inverting the data executed during each operation in accordance with the value of the corresponding polarity field, each polarity field comprising at least one bit for inverting or not inverting a set of bits of said data.

3. The BIST system of claim 1, wherein each instruction further comprises a data field for determining the data to be processed at each operation.

4. The BIST system of claim 3, wherein the data field include a number of bits smaller than the number of bits of a memory word, further comprising means for expanding the bits contained in the data field to the size of a memory word.

5. The BIST system of claim 1, wherein each instruction further comprises a wait field, and the system comprises means for suspending its operations in accordance with the data contained in the wait field.

6. The BIST system of claim 1, wherein each instruction further comprises a test-end field specifying a last instruction.

7. The BIST system of claim 1, wherein the address control field contains an up or down instruction specifying an incrementing or decrementing of an address counter.

8. The BIST system of claim 1, further comprising an access mechanism for loading in the chip a data background to be used during test operations.

9. The BIST of claim 8, comprising:
- a first memory wherein said data background is preloaded, said first memory being addressed and controlled to execute the same sequence of operations as the memory under test, but each write operation being changed to a replacement read operation executed in advance with respect to the corresponding write operation;
- means for writing in the memory under test data obtained from said replacement read operation; and
- a comparator for comparing the data read in the memory under test with corresponding data obtained from said first memory.

10. The BIST of claim 9, further comprising a set of EXCLUSIVE OR gates having a first set of inputs coming from the outputs of said first memory, a second set of inputs coming from a polarity field of the BIST and a set of outputs connected to the data input of the memory under test.

11. The BIST of claim 9, wherein said first memory has a smaller size than the memory under test and is addressed only by least significant bits of each address applied to the memory under test.

12. The BIST of claim 9, wherein said first memory has a smaller size than the memory under test and is addressed by a dedicated counter.

13. The BIST of claim 9, wherein said first memory has a smaller size than the memory under test and is addressed by data from a preloaded shift register.

14. The BIST of claim 8, wherein said data background is loaded in the memory under test, before executing a test algorithm,
- wherein each sequence of consecutive test operations performed at a given address starts by a read operation, each write operation of a sequence of consecutive operations being executed with data from a former read operation of said sequence of consecutive operations, said data being inverted or not inverted.

* * * * *